United States Patent
Martyniuk et al.

(10) Patent No.: US 6,998,217 B2
(45) Date of Patent: Feb. 14, 2006

(54) CRITICAL DIMENSION EDGE PLACEMENT AND SLOPE ENHANCEMENT WITH CENTRAL PIXEL DOSE ADDITION AND MODULATED INNER PIXELS

(75) Inventors: Jerry Martyniuk, Portland, OR (US); H. Christopher Hamaker, Portland, OR (US); Matthew J. Jolley, Portland, OR (US); Peter Pirogovsky, Portland, OR (US); Asher Klatchko, Portland, OR (US); Richard E. Crandall, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 201 days.

(21) Appl. No.: 10/326,953

(22) Filed: Jan. 6, 2003

(65) Prior Publication Data

US 2004/0131977 A1 Jul. 8, 2004

(51) Int. Cl.
G03C 5/00 (2006.01)
(52) U.S. Cl. .................................................... 430/296
(58) Field of Classification Search ............... 430/296, 430/942, 312, 315; 716/19
See application file for complete search history.

(56) References Cited

U.S. PATENT DOCUMENTS

| | | | | | |
|---|---|---|---|---|---|
| 4,737,858 | A | * | 4/1988 | DeBaryshe | 358/296 |
| 5,241,185 | A | * | 8/1993 | Meiri et al. | 250/492.2 |
| 5,393,987 | A | * | 2/1995 | Abboud et al. | 250/492.22 |
| 5,635,976 | A | * | 6/1997 | Thuren et al. | 347/253 |
| 6,436,607 | B1 | * | 8/2002 | Lozes et al. | 430/296 |
| 6,556,702 | B1 | * | 4/2003 | Rishton et al. | 382/144 |
| 2003/0160980 | A1 | * | 8/2003 | Olsson et al. | 358/1.9 |
| 2003/0233630 | A1 | * | 12/2003 | Sandstrom et al. | 716/19 |

OTHER PUBLICATIONS

A.Murray et al.; "Feasibility study of new graybeam writing strategies for raster scan mask generation"; J.Vac.Sc.& Technol. B, v.11 (1993), p. 2390-2396.*

* cited by examiner

Primary Examiner—S. Rosasco
(74) Attorney, Agent, or Firm—Jung-hua Kuo

(57) ABSTRACT

Systems and methods for gray scale lithography for defining edges such as on microelectronic device patterns during integrated circuit fabrication are disclosed. Methods for critical dimension edge placement and slope enhancement utilize central pixel dose addition or modulated inner pixels. A method for gray scale lithography for defining edges of features generally comprises identifying a center pixel of a feature, exposing the general width of the feature including the identified center pixel with full doses, and enhancing the identified center pixel by exposing the identified center pixel with additional dose to accurately place the edge of the feature, whereby the edge of the feature is defined and moved by exposing the center pixel with the additional dose. Another method for gray scale lithography generally comprises identifying a proximal interior pixel immediately interior to an unbiased edge of the feature, exposing the general width of the feature full dosages, and exposing the proximal interior pixel with a dosage of elevated intensity selected from a set of gray levels, the elevated intensities being above the full dosage, the set of gray levels biases the edge of the feature and facilitates in further moving the edge of the feature in fractional increments of a pixel depending upon the gray level selected.

18 Claims, 11 Drawing Sheets

|    | GL2A  |
|----|-------|
| 0  | 1.361 |
| 1  | 1.441 |
| 2  | 1.525 |
| 3  | 1.613 |
| 4  | 1.705 |
| 5  | 1.801 |
| 6  | 1.903 |
| 7  | 2.01  |
| 8  | 2.123 |
| 9  | 2.243 |
| 10 | 2.37  |
| 11 | 2.505 |
| 12 | 2.649 |
| 13 | 2.802 |
| 14 | 2.966 |
| 15 | 3.141 |

| | GL2A |
|---|---|
| 0 | 0 |
| 1 | 0 |
| 2 | 0 |
| 3 | 0 |
| 4 | 0 |
| 5 | 0 |
| 6 | 0 |
| 7 | 0 |
| 8 | 0.08 |
| 9 | 0.25 |
| 10 | 0.42 |
| 11 | 0.58 |
| 12 | 0.74 |
| 13 | 0.9 |
| 14 | 1.05 |
| 15 | 1.21 |

| | GL2B |
|---|---|
| 0 | 1.36 |
| 1 | 1.44 |
| 2 | 1.52 |
| 3 | 1.61 |
| 4 | 1.7 |
| 5 | 1.8 |
| 6 | 1.9 |
| 7 | 2.01 |
| 8 | 2.01 |
| 9 | 1.88 |
| 10 | 1.76 |
| 11 | 1.63 |
| 12 | 1.5 |
| 13 | 1.38 |
| 14 | 1.25 |
| 15 | 1.13 |

CRITICAL DIMENSION EDGE PLACEMENT AND SLOPE ENHANCEMENT WITH CENTRAL PIXEL DOSE ADDITION AND MODULATED INNER PIXELS

BACKGROUND OF THE INVENTION

1. Field of the Invention

The present invention relates generally to photolithography. More specifically, systems and methods for gray scale lithography for defining edges such as on microelectronic device patterns during integrated circuit fabrication are disclosed.

2. Description of Related Art

Conventional reticle writing systems create and move edges by modulating pixel strengths on and mainly outside of an edge with partial pixel intensities, i.e., gray levels (GLs). As a feature becomes smaller, the two edges of one-dimensional features interfere with each other to cause undersized features with non-linear degradation in size and slope. As the design feature becomes smaller, conventional methods of exposing small features results in a diminishing CD size when compared to the design CD size. The problem is exacerbated in that uniformity or variability of the critical dimension (CD) is also degraded and, when convolved with process constraints, yield is severely limited. Critical dimension (CD) generally refers herein to the width of a patterned line or the distance between two lines of the sub-micron sized circuits in a chip.

Thus, it is desirable to improve upon reticle writing systems that create and move edges by modulating pixel strengths with GLs so that the reticle writing system can write smaller features with increased CD fidelity, improved CD uniformity, and improved edge slope.

SUMMARY OF THE INVENTION

Systems and methods for gray scale lithography for defining edges such as on microelectronic device patterns during integrated circuit fabrication are disclosed. It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

A method for gray scale lithography for defining edges of features generally comprises identifying the center pixel(s) of a feature, exposing the general width of the feature including the identified center pixel(s) with full doses, and enhancing the identified center pixel(s) by exposing the identified center pixel with additional dose less than the full dose to define the edge of the feature, whereby the edge of the feature is defined and returned to design location by exposing the center pixel with the additional dose.

The additional dose may be, for example, an additional approximately 7% above full dose. The step of exposing preferably takes into account an increase in feature size resulting from the enhancing step. The step of identifying preferably identifies one or two most central pixels of the feature depending upon the width of the feature and whether the width is even (two most central pixels) or odd (one most central pixel). The method may further comprise determining a spot size to pixel space ratio where the additional dosage of the center pixels identified is determined by writing beam spot size to pixel space ratio. The exposing may be performed in an additional writing pass and/or exposing with a reserved larger than normal gray level. The exposed feature may be a one or two dimensional feature or a contact hole, for example, and may be a feature under a predetermined threshold size, a primary feature, and/or a feature formed after fracturing.

Another method for gray scale lithography generally comprises identifying a proximal interior pixel immediately interior to an unbiased edge of the feature, exposing the general width of the feature in standard full dosages, but exposing the proximal interior pixel with a dosage of elevated intensity above the full dosage and selected from a set of gray levels. This set of gray levels biases the edge of the feature and facilitates in further moving the edge of the feature in fractional increments of a pixel depending upon the gray level selected thereby controlling the features size or edge location. The edge location may be controlled solely by the proximal interior pixel. In such case, the elevated intensities of the set of gray levels range from approximately 1 to 3 times the "normal" dose.

The method may also include identifying a second pixel immediately exterior to the unbiased edge and exposing the second pixel with a dosage selected from a second set of gray levels to facilitate in further adjusting the edge location of the feature depending upon the gray level selected. The second pixel is immediately interior to the edge of the feature after the step of exposing the proximal interior pixel for a subset of the set of gray level intensities. In addition, the second set of gray levels for the second pixel contains levels set to 0 for levels corresponding to edge positions interior to the second pixel. For example, the second set of gray levels for the second pixel may comprise 16 levels, the first 8 levels being set to 0 and the gray levels for the proximal interior pixel increases from the first to the eighth level to move the edge a distance of approximately equal to ½ of a pixel separation. The set of gray levels for the second pixel ranges from 0 to approximately 1.2 and the set of gray levels for the proximal interior pixel ranges from approximately 1.1 to approximately 2.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF SPECIFIC EMBODIMENTS

Figure 1:
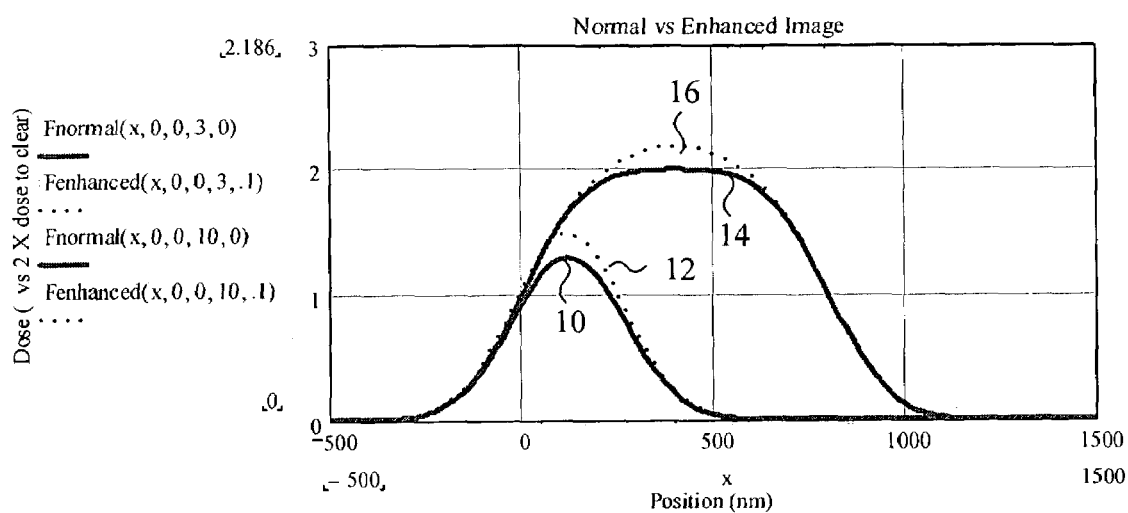
FIG. 1 illustrates the effect of adding an extra 7% of full dose to the most central pixel of one-dimensional features.

Systems and methods for gray scale lithography for defining edges such as on microelectronic device patterns during integrated circuit fabrication are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Two methods for gray scale lithography for defining edges are described herein. The first method comprises adding dose to the most central pixel or pixels of the features, such as all features, features under a certain threshold size, primary features, and/or features formed after fracturing, for example. In other words, dose is added to the centers or central regions of features. The second method comprises modulation of pixel(s) just interior to edges of features in order to create and locate edges. The method for modulation of inner pixel(s) requires doses of elevated intensities, i.e., intensities at greater than normal printing dose. Both methods provide the advantages of increased critical dimension (CD) fidelity, improved CD uniformity, and improved edge slope, particularly for small features. Each of these two methods will now be described in turn.

Modeling to Illustrate Effects of Dose Addition and Inner Pixel Modulation

For aerial images modeled and described herein, it is assumed that features are normalized at 2X dose to clear without any added dose at the center of a feature. The normalization is for a sufficiently large image such that there are no competing edge or proximity effects, i.e., as a written line gets smaller in normal gray-level (GL) printing, the dose in the center of the line will fall non-linearly below the 2X dose to clear point until the dose in the center of the line falls below the 1X dose to clear value and no longer registers. (See FIG. 1.) As the dose at the center of the line falls below the 2X dose to clear, the actual CD will be smaller than the design CD, which is modeled as CD linearity, the edge slope will degrade, and the CD uniformity will be adversely affected. Although the modeling herein is for pixelized separate doses, the modeling similarly applies to scanned dose deposits such as those formed in the scan direction of, for example, typical ALTA type machines promulgated by the assignee of the subject patent, i.e., mask or reticle writers. The term pixel as used herein generally refers to a location to turn a beam on or off at distinct intensities or GLs. For purposes of the model, a typical 8-pass mode writing strategy is utilized. The writing beam spot size radius ($\omega$) is approximately 250 nm and the effective pixel separation is 80 nm.

The modeling is based generally on three propositions. Each of these three propositions are described in more detail below.

The first proposition is that in gray-level printing, dose, which is deposited in Gaussian-type packages, will degrade or enhance the edge slope if written exterior or upon the edge, respectively. Proof of the first proposition is as follows:

Let F(x) be an Erfc-function (error function) type of dose profile normalized to 2X dose to clear at a sufficiently large distance away from the edge. This profile will clear the resist at x=0, or its 1 × dose to clear value.

Let G(x−δ) be any Gaussian-type or clearly "humped" distribution of dose centered at δ, which is sufficiently large to alter the dose at x=0. The distribution is short ranged so as to not affect the 2X dose to clear value but not so short ranged so that it affects the monotonicity of the total summed dose near the edge. The G function may be:

$$G(x) = e^{\frac{-2x^2}{\omega^2}} \text{ or } G(X) = e^{-\frac{x^2}{2\sigma^2}}$$

where w is the spot size radius and σ is one standard deviation.

The slope at any point x is, H(x)=F'(x)+G'(x−δ), where ' represents the derivative with respect to x. Thus, for any humped distribution, the contribution of G' to the total derivative (near x=0) is positive for negative δ and negative for positive δ. Thus, the slope at the edge or 1X dose to clear point will degrade for extra doses delivered exterior to the feature and improve for dose delivered interior to the feature.

The second proposition is that, for Gaussian pixel doses, the maximum slope possible, at dose to clear, is the slope of the Gaussian at its inflection point, indicating that the best pixel to modulate for edge movement is an interior pixel that is located at σ or ω/2 interior to the edge, where σ is the standard deviation of the Gaussian and ω is the 1/e² spot size radius. As the writing beam spot size radius (ω) is approximately 250 nm in the exemplary model herein, as noted above, the modeled edge should be mainly formed by a pixel 125 nm interior to the final edge. Proof of the second proposition is as follows:

For a Gaussian beam normally written as:

$$I = I_0 e^{-\frac{2x^2}{\omega^2}} = I_0 e^{-\frac{x^2}{2\sigma^2}},$$

the second derivative vanishes at $x=\omega/2$.

For modulation of inner pixels, the problem with forming an edge by a pixel displaced by $\omega/2$ is that it requires dosages far in excess of normal. Further, to move an edge an additional 80 nm using this pixel only would require doses approaching 4 times the normal dose. Also, because of pattern constraints it may not be possible to always write with doses centered $\omega/2$ away from the edge. However, a linear combination of two or more pixels, which best approximate this condition, may be utilized.

The third and final proposition is that writing with additional dose in the center of features and/or writing with modulation of inner pixels, i.e., owl's ears (as will be described below) or intensities elevated above normal near the edges, counteracts the effect of CD linearity fall-off as the feature becomes smaller.

Method for Dose Addition to Central Pixel(s) of Features

As noted above, one method for gray scale lithography with improved edge definition comprises adding dose to the most central pixel or pixels of all features, including features formed after fracturing. If centrally located dose is added to larger features, the edges are generally unaffected by the added dose as the edges are sufficiently far away from the central pixel(s) to which dose is added. Typically, only features under a threshold size approximately equal to the writing beam spot size radius ($\omega$) are affected by the central dose addition. However, for smaller features, the added dose can be "tuned" to provide better edge fidelity (i.e., better CD linearity), better CD uniformity, and better edge slope.

In one preferred embodiment, the additional dose may be added during an extra pass or may be taken into account in the data path where center pixel(s) of features selected for dose addition are identified and written with a "reserved" larger than normal dose. The dose addition method facilitates in counteracting the adverse edge-edge interference for small features. In other words, the dose addition makes up the missing dose due to interfering edges for small features.

It is noted that although in the exemplary model described herein only one or two central pixel(s) are enhanced, the process may be applied to any distinct number of center pixels typically determined in general by the spot size to pixel space ratio. In the present example, the writing beam spot size radius ($\omega$) is approximately 250 nm and the effective pixel separation is 80 nm so that the spot size to pixel space ratio is approximately 3 while the number of central pixels to be exposed with extra dosage is one or two depending on symmetry. For example, one most central pixel may be enhanced where the width of the feature is approximately an odd number of pixels and two most central pixels may be enhanced where the width of the feature is approximately an even number of pixels. In addition, the method is similarly applicable to enhance two-dimensional features such as contact holes although CD linearity with central intensity addition to enhance two-dimensional features will generally behave differently from that for one-dimensional features.

FIG. 1 is a graph illustrating the effect of adding an extra 7% of full dose to the most central pixel of one-dimensional features, i.e., lines. Note that the width of the feature is demarcated by where the aerial "dose" crosses a value of 1, i.e., the feature will "clear" the photoresist only if the accumulate dose is greater than 1. The one-dimensional features modeled are a 3-pixel (240 nm) wide feature and a 10-pixel (800 nm) wide feature. The solid lines 10, 14 illustrate conventional or normal printing of the 3- and 10-pixel wide features, respectively. The dotted lines 12, 16 illustrate printing with the extra 7% dosage added at the central pixel of the 3- and 10-pixel wide features, respectively. The edges of each of these features occur at approximately the 1X dose to clear point, i.e., 0 nm for the left edges and approximately 240 and 800 nm for the right edges of the 3- and 10-pixel wide features, respectively.

The edge slope is an important metric and relates directly to process capability and yield. As is evident, the steeper the line (edge slope) is at the feature edge or at the dose to clear point, the less the position of the edge of the feature (and thus the size of the feature) is affected by process parameters or variables such as temperature, alkalinity, laser power variation, photoresist variation, acidity, etc. In other words, because process parameters or variables may affect the exact dose to clear point relative to the design dose to clear point, the steeper the line is at the design dose to clear point, the less the actual dose to clear point affects the actual position of the edge of the feature and thus the size of the feature. Thus, it is desirable to have the dose vs. position line to be as steep as possible at the edges of the features (1x dose to clear).

Referring again to FIG. 1, for the 10-pixel wide feature, dose addition at the center pixel of the feature generally does not affect the edge slope at the edges as the edges are sufficiently far away from the center pixel that they are unaffected by pixels further than w away. However, for the 3-pixel wide feature, dose addition at the center pixel of the feature steepens the edge slope at both edges as the edges are sufficiently close to the center so as to be affected by the extra dose added at the central pixel. As shown, the 3-pixel wide feature is also slightly wider as a result of the extra dose added at the central pixel. As such, the writing process should be modified to not only add an extra dose for the center pixel or central region but also to adjust or "tune" the increased dose for maximum efficiency.

Figure 2A:
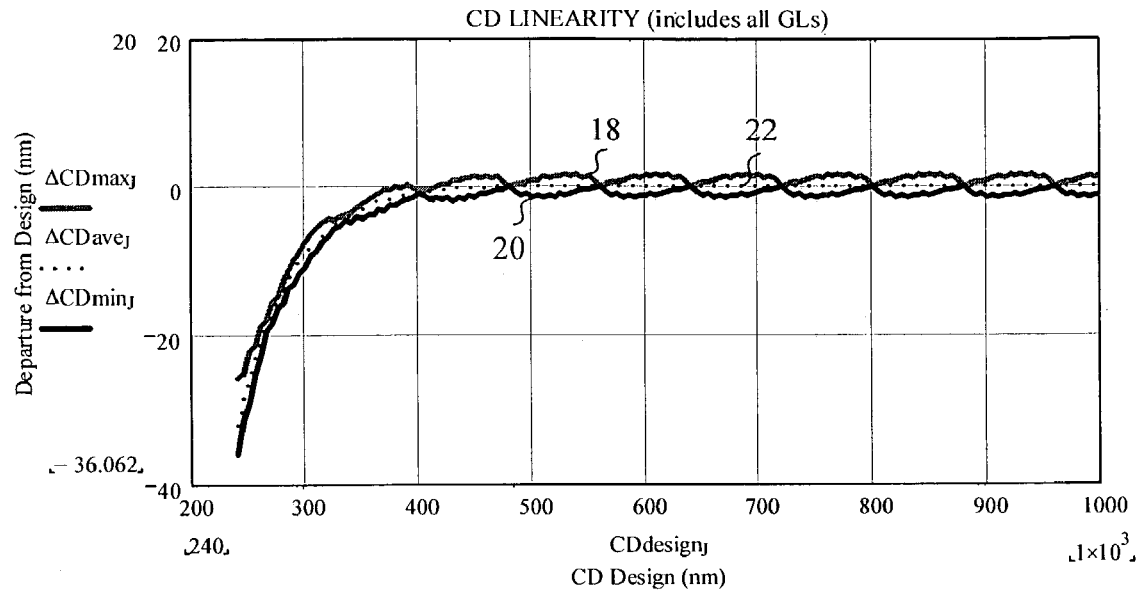
FIGS. 2A and 2B illustrate CD linearity versus design CD for normal printing and for printing with center pixel enhanced by 7% of full dose, respectively.
Figure 2B:
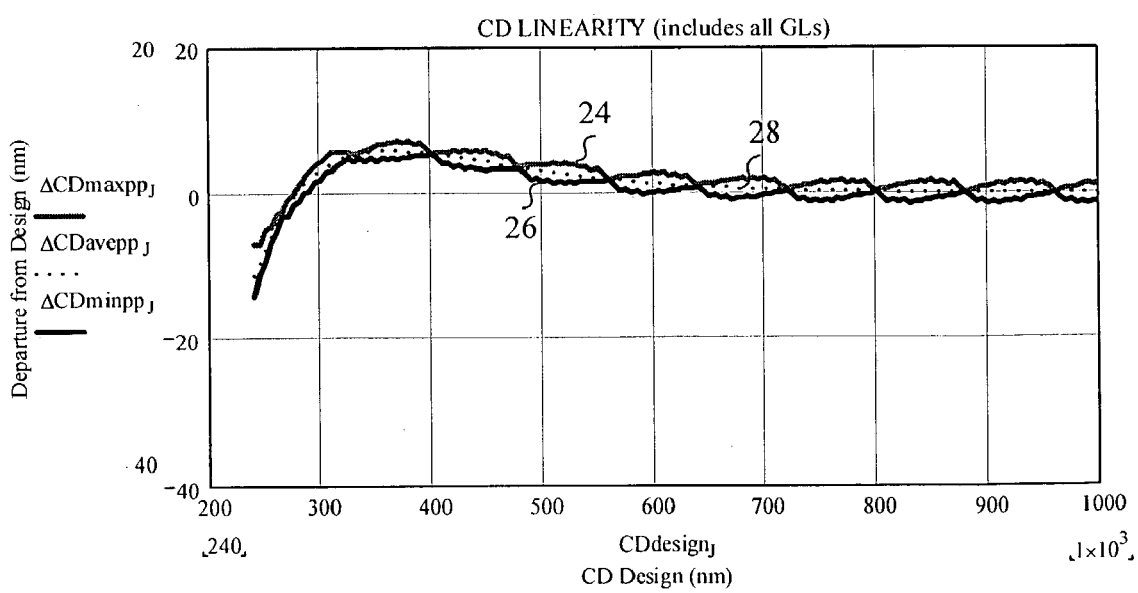

FIGS. 2A and 2B illustrate CD linearity, i.e., aerial image size departure from design versus design CD for normal printing and for printing with center pixel enhanced by 7% of full dose, respectively. The GLs, of which there are typically 16, are modeled such that different feature sizes are possible. Different feature sizes are achieved by selecting a particular GL for the leading edge for a given feature size, thereby resulting in a range of CD departures from design. Ideally, the CD departure from design is 0 for all design CDs. In each of FIGS. 2A and 2B, the upper solid lines 18, 24 illustrate the maximum positive CD departure from design, the lower solid lines 20, 26 illustrate the maximum negative CD departure from design, while the dotted lines 22, 28 illustrate the average of the maximum positive and negative CD departure from design.

Typically, a departure of up to 7 nm, or a 7 nm error is acceptable although departures of, for example, 10 nm or 15 nm of total range is often specified as acceptable CD uniformity. (CD uniformity is usually specified as a range or total variation.) For purposes of the discussion herein, a maximum of 7 nm for error is utilized. As shown in the normal printing modeling of FIG. 2A, the CD linearity drops off at design CDs less than approximately 400 nm such that at design CDs less than approximately 300 nm, the departure from design is greater than 7 nm. At design CDs greater than approximately 400 nm, the average CD departure from design is near the ideal value of 0. In addition, lines 18–22 stop at a CD design value of approximately 240 nm indicating that features are not only undersized, but completely disappear at CD design values below approximately 240 nm for conventional normal printing processes.

In contrast, as shown in the enhanced center pixel modeling of FIG. 2B, the CD linearity increases to a positive value but less than 7 nm larger than nominal at CD design values between approximately 575 nm and 280 nm while at CD design values above approximately 600 nm, the average CD departure from design is near the ideal value of 0. At CD design values between approximately 280 nm and 250 nm, the CD linearity decreases to a negative value but with the departure being less than 7 nm. In addition, features would still clear at designs below 240 nm.

As is evident, the normal printing can print within the error tolerance specification of 7 nm with a design CD of down to approximately 300 nm and higher while the enhanced center pixel printing can print within the error tolerance specification of 7 nm with a design CD of down to approximately 250 nm.

It is noted that the modeling for central pixel dosage addition described herein utilizes a 7% dosage enhancement at the central pixel. The 7% dosage enhancement was selected or tuned for the example presented herein such that the dosage enhancement does not unduly interfere with the printing of small features. For example, in laser tools such as the ALTA 3700, when writing a pixel, the Gaussian distribution spans approximately 500 nm, suitable for a pixel separation of approximately 160 nm such that the laser pixel write influences the nearest one or two pixels. It is noted, however, that any other suitable level of dosage enhancement may be employed. For other spot size to grid size ratios, such as with the ALTA 4000 with a 300 nm spot size and 160 nm grid size ratio or a ratio of approximately 1.8, the additional dosage required will be considerably more.

Figure 3A:
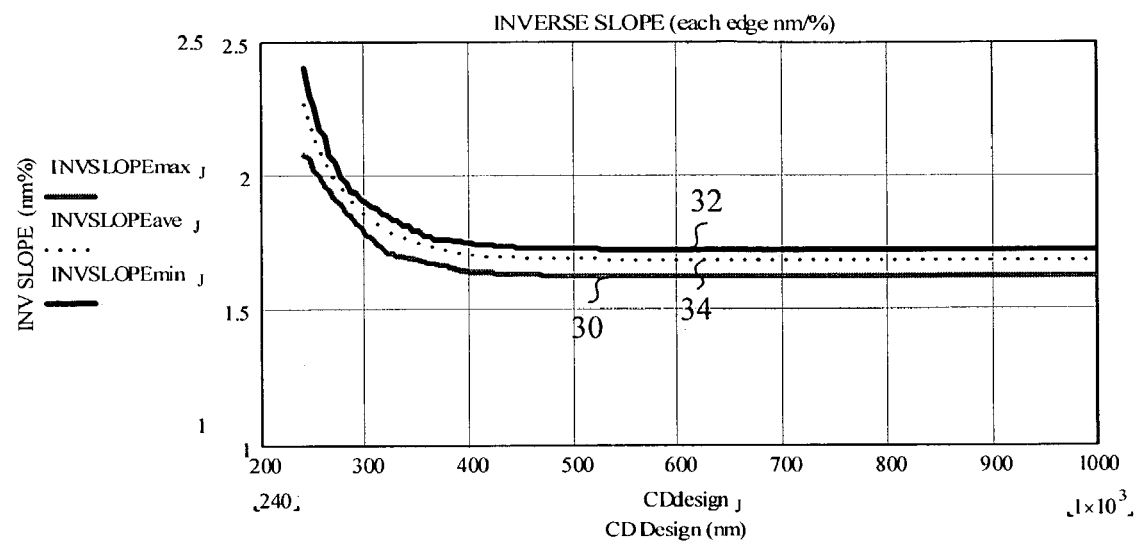
FIGS. 3A and 3B illustrate normalized inverse log slope (NILS) versus design CD for normal printing and for printing with center pixel enhanced by 7% of full dose, respectively.
Figure 3B:
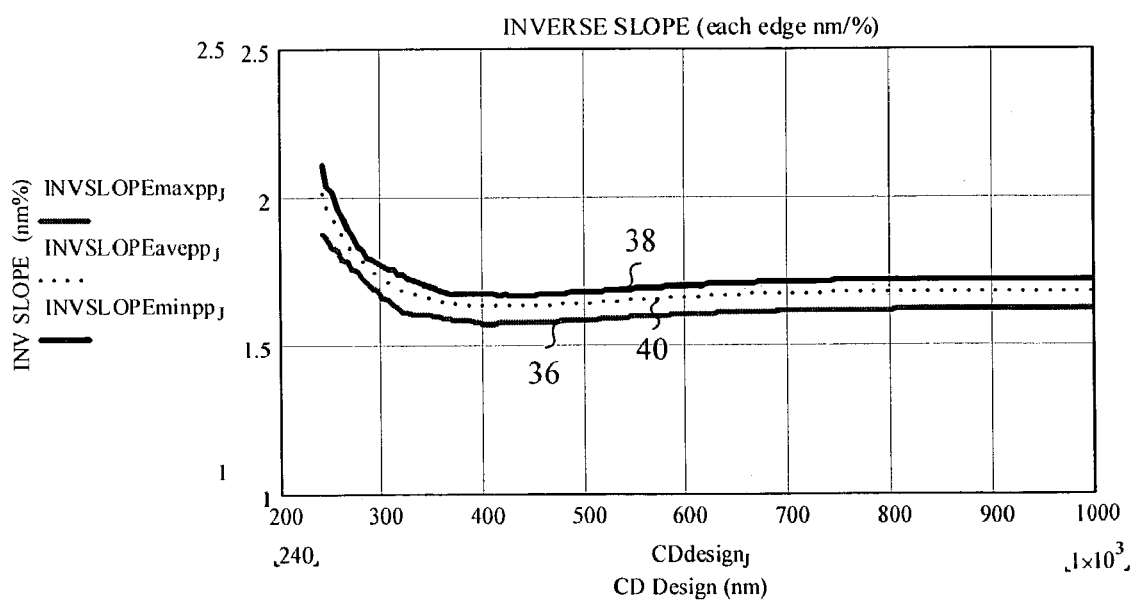

FIGS. 3A and 3B illustrate normalized inverse log slope (NILS) versus design CD for normal printing and for printing with center pixel enhanced by 7% of full dose, respectively. A lower NILS is better, i.e. fewer nm of edge movement per percentage change in dose. For purposes of clarity, the NILS is illustrated. The units for the inverse log slope Y axis is nm per % dose change or nm/%. In each of FIGS. 3A and 3B, the lower solid lines 30, 36 illustrate the maximum inverse log slope, the upper solid lines 32, 38 illustrate the minimum inverse log slope, while the dotted lines 34, 40 illustrate the average of the maximum and minimum inverse log slope. The variation in the solid lines is caused by the particular combination of gray levels that combine to form both edges for a particular feature size. For any given CD design, there is a range of values for the inverse log slope due to the fact that the inverse log slope at any given CD design is dependent upon where the features edge is located relative to the pixel locations for both edges. As is evident from FIGS. 3A and 3B, by adding dose to the center pixel of the feature, slope at the dose to clear point or the feature edge, steepens, particularly for smaller CD design values, i.e., smaller features.

Figure 4A:
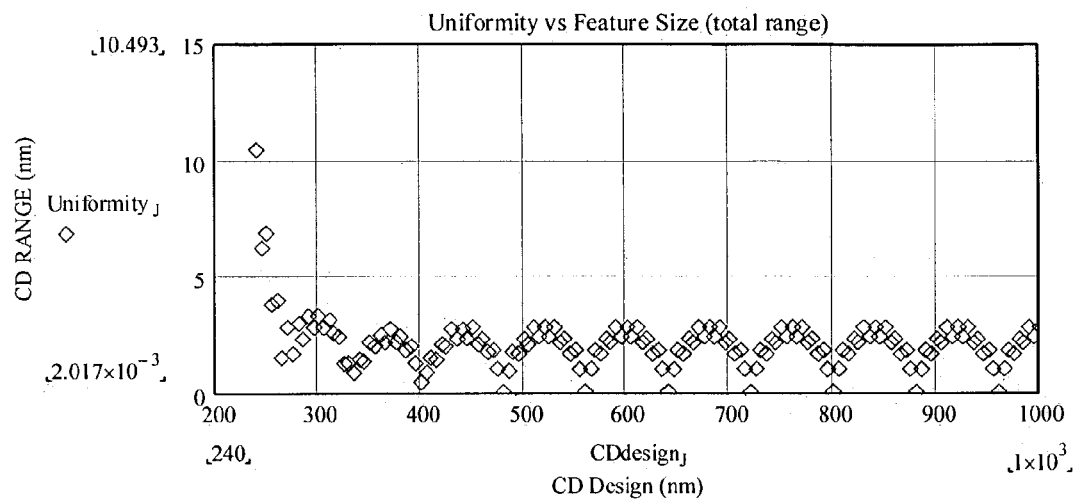
FIGS. 4A and 4B illustrate CD uniformity versus design CD for normal printing and for printing with center pixel enhanced by 7% of full dose.
Figure 4B:
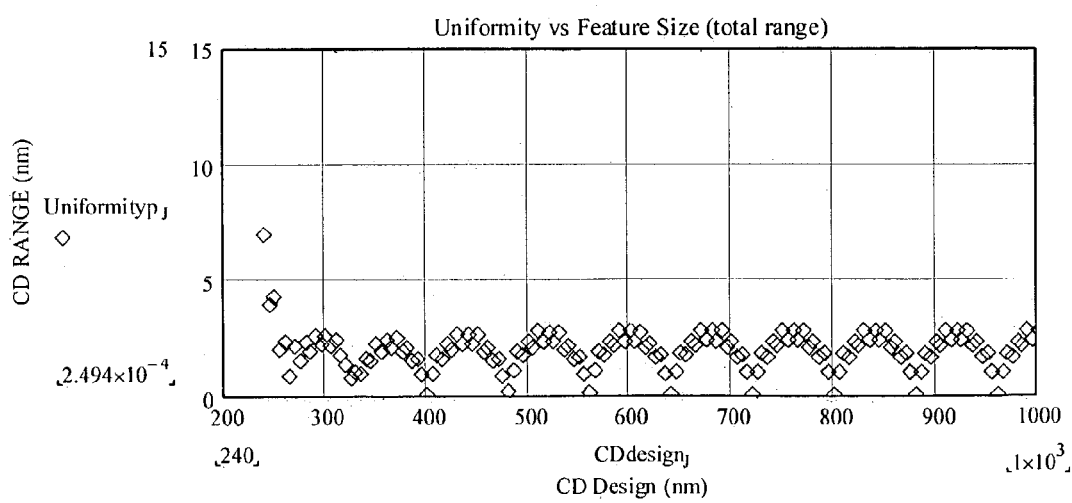

FIGS. 4A and 4B illustrate CD uniformity or the entire range of values due to gray-level variation between the edges versus design CD for normal printing and for printing with center pixel enhanced by 7% of full dose, respectively. FIGS. 4A and 4B illustrate the improvement in uniformity for small features. As a feature size decreases, the edge slope at the 1x dose to clear point diminishes to cause a greater dependence to GL edge to edge interplay and increased variability. It is noted that the actual CD uniformity would be significantly worse than shown when it is convolved with process variability. As shown, the CD range is lowest when an edges falls exactly on a pixel or an interstitial pixel such that the CD range is lowest at multiples of the interstitial pixel separation, i.e., at 240 nm, 320 nm, 400 nm, 480 nm, 560 nm, 640 nm, 720 nm, etc. where the major pixel separation is 160 nm.

CD range (uniformity) for normal printing as shown in FIG. 4A begins to rise sharply at CD design values below approximately 300 nm. In particular, CD range rises from approximately 3.5 nm at a CD design value of 300 nm to over 10 nm at a CD design value of approximately 240 nm. In contrast, CD range for printing with center pixel enhanced by 7% of full dose as shown in FIG. 4B begins to rise at CD design values below approximately 260 nm. In particular, CD range rises from approximately 4 nm at a CD design value of 250 nm to above approximately 7 nm at a CD design value of approximately 240 nm. As is evident from FIGS. 4A and 4B, adding dose to the center pixel of the feature lowers the CD range, i.e., enhances CD uniformity (lower is better), for smaller CD design values, i.e., smaller features.

Method for Modulation of Inner Pixel(s)

As noted above, an alternative method for gray scale lithography for improved edge location and contrast comprises modulation of pixel(s) just interior to edges of features in order to create or move edges. In particular, the method comprises creating or moving an edge by modulating pixel(s) located interior to the edge. The method requires doses of elevated intensities that are greater than normal dose in order to raise the intensity of proximal interior pixel(s), i.e., pixel(s) just interior to the edge, so as to increase the slope at the edge or dose to clear point. The method for modulation of inner pixel(s) also provides the advantages of increased CD fidelity (adherence to size), improved CD uniformity, and improved edge slope particularly for small features.

The method can be tuned to mitigate negative CD linearity effects typical of the conventional printing approach for small features. Generally, CD linearity can be tuned for either 1-D features such as lines or for 2-D features such as contacts but not both. Thus, the method may require compromise between CD linearity for lines and CD linearity for 2-D features. In addition, the method for modulation of inner pixels generally requires data sizing and/or a print architecture change. Furthermore, because of the large GL steps required, CD uniformity may be adversely affected for very small features.

Various schemes may be employed to implement the method for modulation of inner pixel(s) to create and move edges. Two exemplary cases are presented here, namely, modulation of one pixel only and modulation of a combination of two adjacent interior pixels. However, it is to be understood that these are but two exemplary cases and any other suitable scheme may be implemented.

Modulation of One Inner Pixel

In one exemplary embodiment, one pixel interior to an edge is utilized to control edge placement. However, in general, the one pixel modulation method requires larger intensities for the GLs as well as larger steps between the GLs than with normal printing. Such large intensities and large steps between the GLs have a relatively large proximal effect on the other edge of a small feature although the effect is positive in that the small features becomes larger than design rather than smaller or disappearing. Thus, the one-pixel modulation technique will generally exacerbate CD uniformity for small features.

For the inner pixel modulation technique, data is sized prior to print for purposes of ensuring CD fidelity. In the present example, data is sized by 65 nm which is determined by modeling for best CD linearity. Sizing the data by 65 nm is the same as writing with a pixel located at approximately 65 nm interior to the feature.

Figures 5, 6:
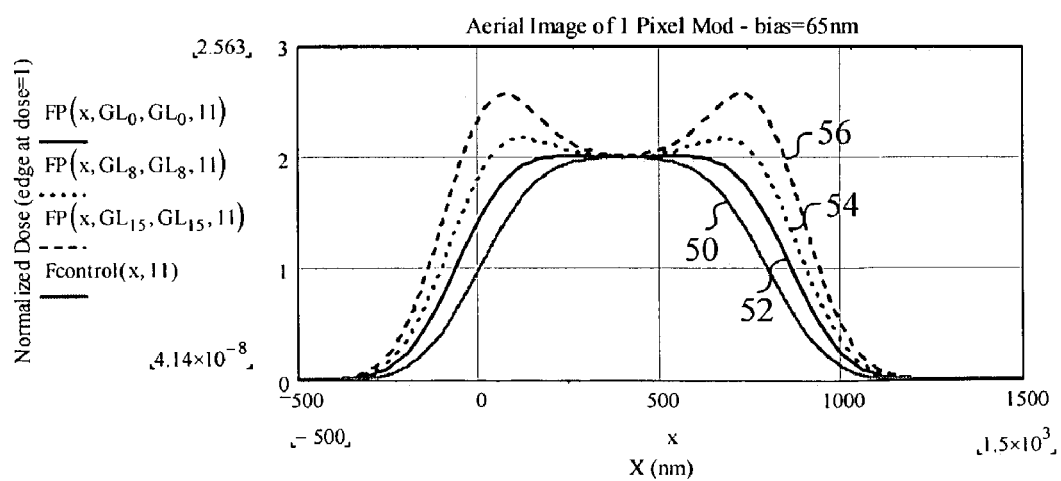
FIG. 5 lists intensities for an exemplary set of GLs for a printing method implementing single inner pixel modulation.
FIG. 6 illustrates an aerial image from normal conventional printing as well as from printing using the inner pixel modulation method having GL intensities shown in FIG. 5.

The intensities of the GLs may be determined by adding the necessary dose to this pixel to move the edge in 5 nm increments, i.e., $\frac{1}{16}$ of a pixel. The strategy includes the interstitial grid such that the effective pixel separation is 80 nm. FIG. 5 is a table that lists intensities for an exemplary set of GLs for a method implementing a one-pixel inner modulation. As shown, the GL intensities range from 1.361 to 3.141 where normally the maximum is 1. Note that these GL intensities are in increments of full-dose where full-dose is determined as the dose necessary to create a 2X dose to clear value in the center of an infinitely large feature. Note this is for a spot size to grid ratio of 3. For example, ALTA 3700's have a spot size of approximately 500 nm and a pixel spacing of 160 nm and thus a spot size to grid ratio of 500/160 or approximately 3.

FIG. 6 illustrates an aerial image from normal printing as well as from printing using the single inner pixel modulation method having GL intensities shown in FIG. 5. Note that parameters (x, $GL_{n\_left}$, $GL_{n\_right}$, 11) refer to x location in nm, gray level at the left and right edges, and feature width of 11 pixels or 880 nm, respectively. In particular line 50 is achieved with normal printing while lines 52, 54, and 56 are achieved with inner pixel modulation printing for GL levels 0, 8, and 15, respectively, i.e. GL intensities 1.361, 2.123, and 3.141. For example, line 52 is an aerial image formed by the pixel dosages 1.36, 1, 1, 1, . . . . Lines 54, 56 achieve "owl's ears" in which extra accumulated intensities are interior to each edge and greater than that experienced in the middle of the feature. As shown, the single pixel modulation method improves edge slope as contrasted with the normal conventional printing method.

Figure 7:
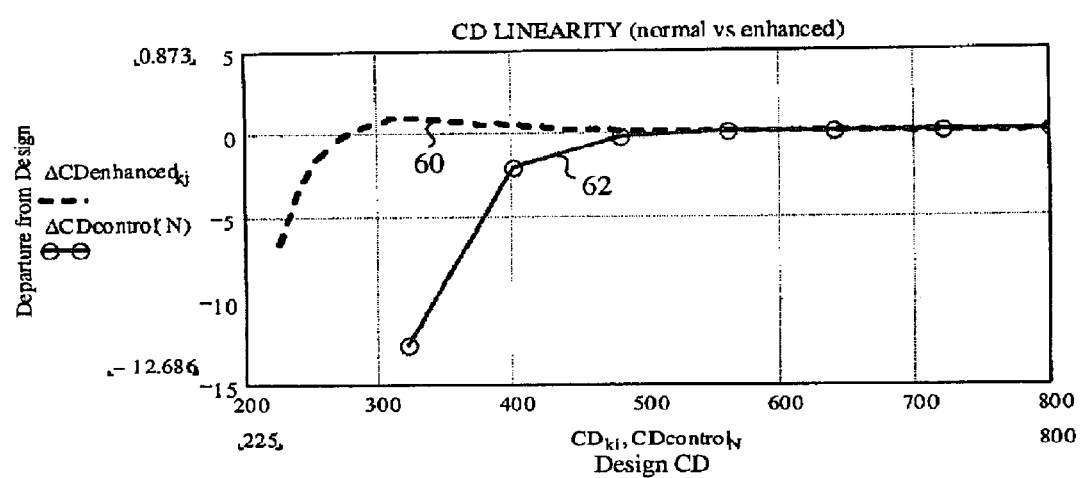
FIG. 7 illustrates CD linearity versus design CD for normal conventional printing and printing using the single inner pixel modulation method.

FIG. 7 illustrates CD linearity or aerial image size departure from design versus design CD for normal conventional printing 60 and for printing using the single inner pixel modulation method 62, respectively. FIG. 7 is modeled with only one edge at GL intensity level 0. It is noted that a more complete modeling with both edges would show that CD uniformity is dependent on the GL scheme for both edges used for a particular feature size. Nonetheless, as is evident from FIG. 7, CD linearity for small features, particular those less than approximately 450 nm, is greatly improved over conventional printing. In addition, the normal conventional printing method modeled herein cannot print below 300 nm while the single inner pixel modulation scheme modeled here can print down to approximately 225 nm.

One caveat of modulating only a single pixel interior to the edge to control the edge placement is the requirement for large intensities for the GLs as well as large steps between the levels, for example, as shown in FIG. 5. As noted above, such large intensities for the GLs as well as the large steps between the GLs can have a relatively large proximal effect on the other edge of a small feature. However, the effect is positive in that the small features becomes larger than design rather than disappearing. Thus, the single pixel modulation method may exacerbate problems with CD uniformity for small features.

Modulation of Two Inner Pixels

Modulating two pixels rather than one pixel interior to the edge to shift the edge can significantly counteract the proximal effect noted above with reference to the single pixel inner modulation method. Because the proximity effect is nonlinear, CD uniformity is improved and the magnitude of the extra dose will not be as significant as when a single one pixel inner modulation method is employed.

First, a pixel interior to the edge is elevated by a dosage amount which biases the edge by 65 nm as determined from CD linearity considerations. After moving the edge 40 nm from the biased edge in the first 8 steps where each step is 5 nm or $\frac{1}{16}$ of a pixel using 8 of the GL intensity levels, the next pixel is now also interior to the edge due to the 65 nm bias and the 40 nm edge movement being greater than the separation of 80 nm between pixels. That next pixel can be turned on to control the edge movement for the last 8 steps or the last 40 nm.

It is noted that other methods may be employed to shift the edge in $\frac{1}{16}$ pixel or 5 nm increments. However, the present example will serve to illustrate the enhancements from modulation of inner pixels and the improvements over the single pixel modulation method. As will be described in more detail below, the two pixel modulation method improves upon the single pixel modulation approach and requires only a maximum of approximately 2 times the dose on any given edge pixel of a normal print method.

Figures 8A, 8B, 9:
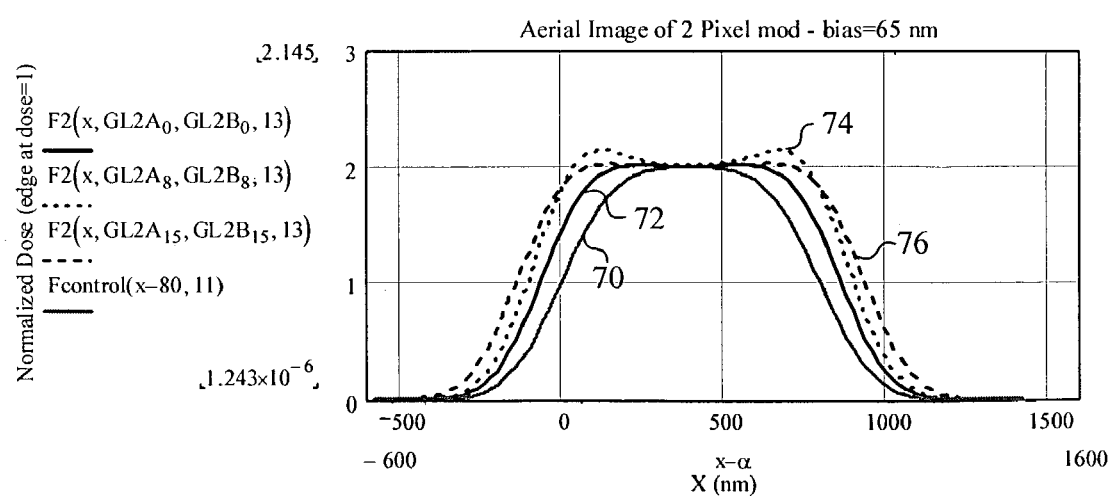
FIGS. 8A and 8B are tables listing intensities for an exemplary set of GLs for a method implementing a two-pixel inner modulation.
FIG. 9 illustrates an aerial image from normal conventional printing and from printing using a two-pixel inner modulation method having GL intensities shown in FIGS. 8A and 8B.

FIGS. 8A and 8B are tables listing intensities for an exemplary set of GLs for a two-pixel inner modulation method. In particular, FIG. 8A lists the GL intensities (GL2A) for the first inner pixel just interior of the feature edge and FIG. 8B lists the GL intensities (GL2B) for the second inner pixel interior of the feature edge, i.e., interior to the first inner pixel. As shown, the GL intensities (GL2A) for the first inner pixel is 0 for the first 8 levels and range from 0.08 to 1.21 for the last 8 levels. In addition, the GL intensities (GL2B) for the second inner pixel range from 1.13 to 2.01. As noted above, the GL intensities (GL2B) for the second inner pixel are determined to bias or move the edge by 65 nm. The first 8 levels GL intensities (GL2B) for the second inner pixel are utilized without the GL intensities (GL2A) for the first inner pixel to move the edge 40 nm or the first 8 steps where each step is 5 nm or $\frac{1}{16}$ of a pixel from the biased edge. The last 8 levels (levels 8–15) of the GL intensities (GL2A) for the first inner pixel are utilized in conjunction with the corresponding levels of the GL intensities (GL2B) for the second inner pixel to control the edge movement for the last 8 steps or the last 40 nm.

Note that these GL intensities are in increments of full-dose where full-dose is determined as the dose necessary to create a 2X dose to clear value in the center of an infinitely large feature. The intensities of the GLs are determined by adding the necessary dose to each of the two interior pixels to move the edge in 5 nm increments or $\frac{1}{16}$ of a pixel. The strategy includes the interstitial grid such that the effective pixel separation is 80 nm.

FIG. 9 illustrates an aerial image from normal conventional printing as well as from printing using a two-pixel inner modulation method having GL intensities shown in FIGS. 8A and 8B. In particular line 70 is achieved with normal printing while lines 72, 74, and 76 are achieved with two inner pixel modulation printing for GL levels 0, 8, and 15, respectively. Line 72 utilizes GL intensities of 0 and 1.36 for the first and second inner pixels interior of the feature edge, respectively; line 74 utilizes GL intensities of 0.08 and 2.01 for the first and second inner pixels interior of the feature edge, respectively; and line 76 utilizes GL intensities of 1.21 and 1.13 for the first and second inner pixels interior of the feature edge, respectively. As shown, the two inner pixel modulation method improves edge slope as contrasted with the normal conventional printing method.

Figure 10:
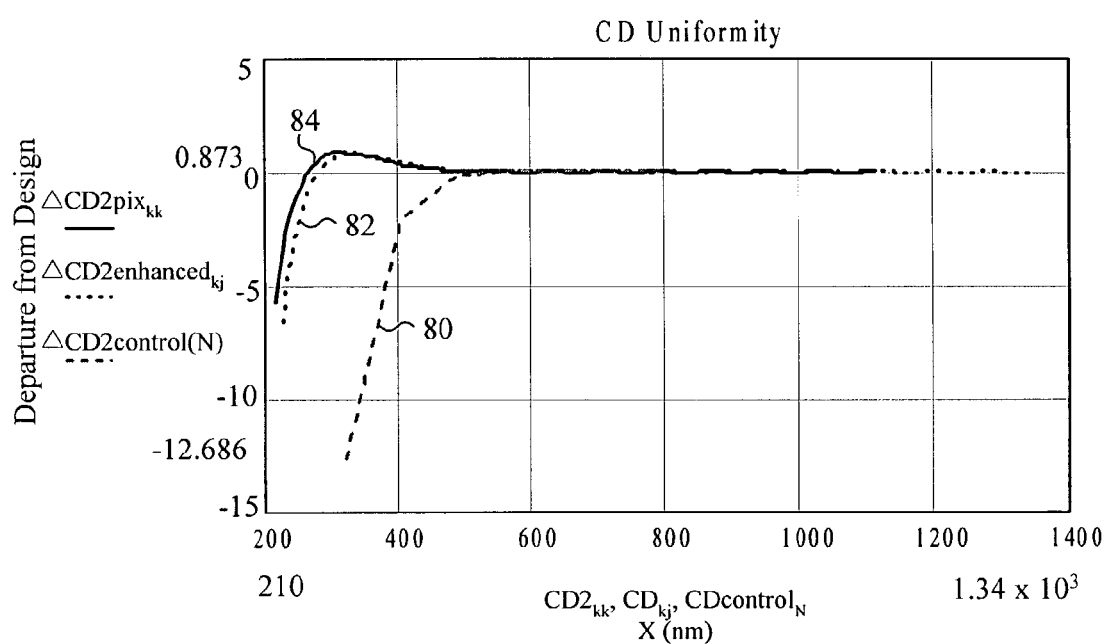
FIG. 10 illustrates CD linearity versus design CD for normal conventional printing, printing using the single inner pixel modulation method, and printing using the two inner pixel modulation method.

FIG. 10 illustrates CD linearity or aerial image size departure from design versus design CD for normal conventional printing 80, for printing using the single inner pixel modulation method 82, and for printing using the two inner pixel modulation method 84, respectively. It is noted that FIG. 10 models only one edge at GL intensity level 0 and if both edges were modeled, line 82 corresponding to printing using the single inner pixel modulation method would oscillate worse than line 84 corresponding to printing using the two inner pixel modulation method. Nonetheless, as is evident from FIG. 10, CD linearity for small features, particular those less than approximately 450 nm, is greatly improved over conventional printing.

The edge slope is an important metric and relates directly to process capability and yield. As is evident, the steeper the line (edge slope) is at the feature edge or at the dose to clear point, the less the position of the edge of the feature (and thus the size of the feature) is affected by process parameters or variables such as temperature, alkalinity, laser dose variability, acidity, etc. In other words, because process parameters or variables may affect the exact dose to clear point relative to the design dose to clear point, the steeper the line is at the design dose to clear point, the less the actual dose to clear point affects the position of the edge of the feature and thus the size of the feature. Thus, it is desirable to have the dose vs. position line to be as steep as possible at the edges of the feature.

Figure 11A:
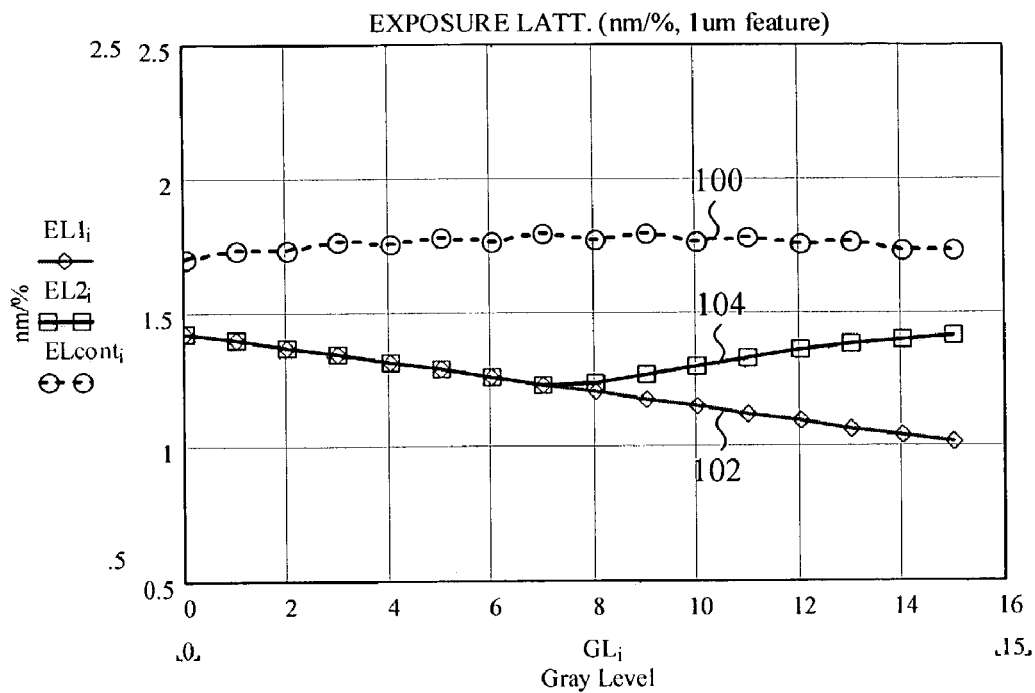
FIGS. 11A and 11B illustrate normalized inverse log slope (NILS) versus design CD for normal conventional printing, printing using the single inner pixel modulation method, and printing using the two inner pixel modulation method for a 1 μm feature and a 320 nm feature, respectively.
Figure 11B:
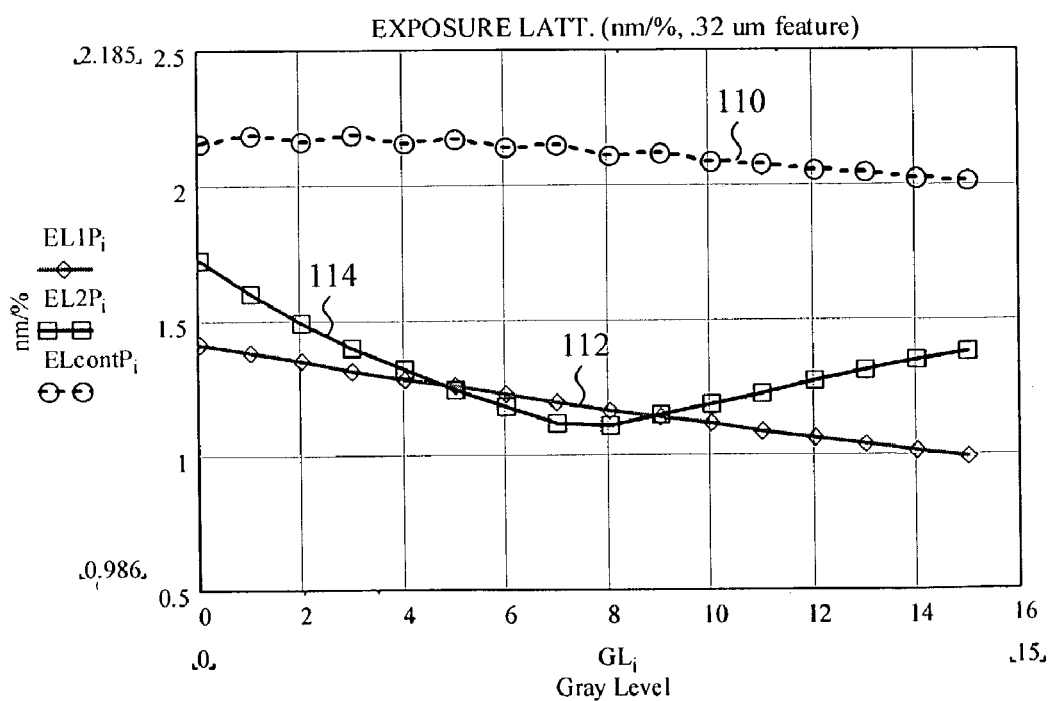

FIGS. 11A and 11B illustrate normalized inverse log slope (NILS) versus design CD for normal conventional printing 100, 110, for printing using the single inner pixel modulation method 102, 112, and for printing using the two inner pixel modulation method 104, 114, for a 1 $\mu$m (large) feature and a 320 nm (small) feature, respectively. For purposes of clarity, the NILS is illustrated. If the exposure is normalized to 2X dose to clear, the NILS is the inverse of the slope at the edge, i.e., the dose to clear point. The units for the inverse log slope (Y axis) is nm per % dose change, i.e., nm/%.

As is evident from both FIGS. 11A and 11B for large and small features, by modulating a single or two interior pixels of the feature, slope at the dose to clear point, i.e., the feature edge, steepens as is desirable. Thus, the interior pixel modulation method increases slope and diminishes slope sensitivity for small features. As shown and discussed with reference to FIGS. 1 and 3, the slope diminishes for small features which this print method counteracts while also making the size closer to design.

Figure 12A:
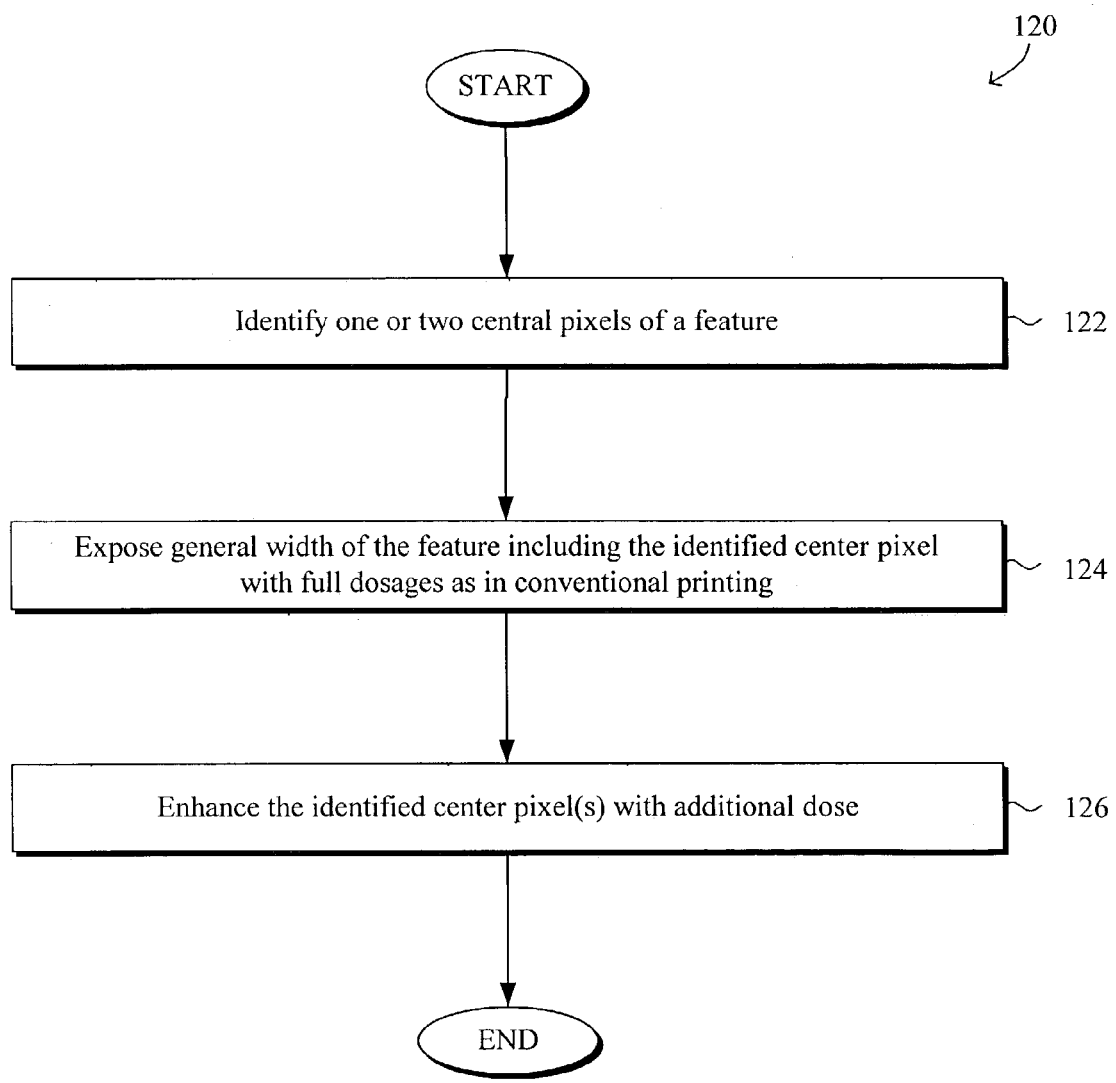
FIG. 12A is a flowchart illustrating processes for gray scale lithography employing central pixel dose addition for defining edges.
Figure 12B:
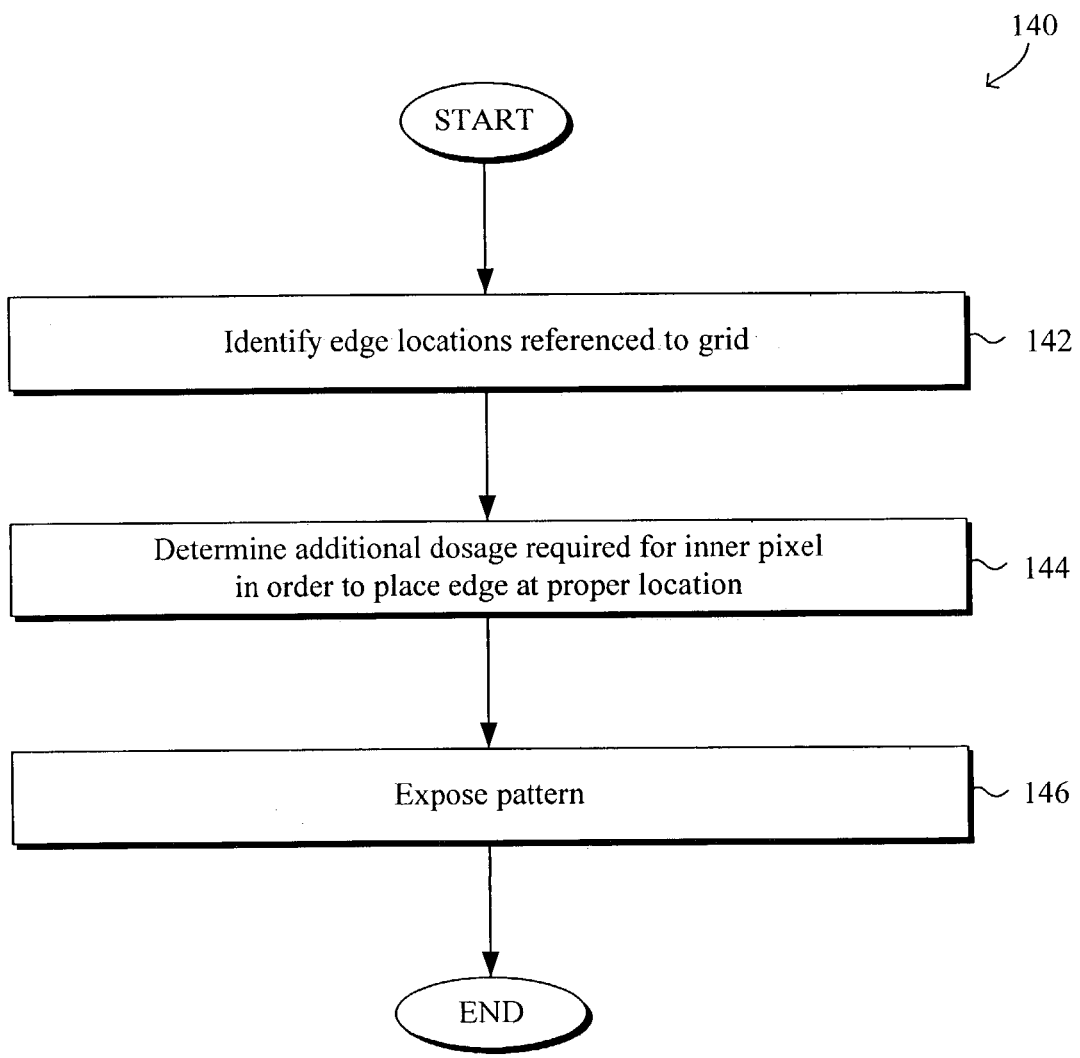
FIG. 12B is a flowchart illustrating processes for gray scale lithography employing inner pixel modulation for defining edges.

FIGS. 12A and 12B are flowcharts illustrating processes for gray scale lithography employing central pixel dose addition and inner pixel modulation, respectively, for defining edges. Specifically, FIG. 12A is a flowchart illustrating a process 120 for gray scale lithography employing central pixel dose addition for defining edges. In particular, at step 122, one or two central pixels of a feature are identified. At step 124, the general width of the feature including the identified center pixel is exposed with full dosages as in conventional printing. Next, at step 126, the identified center pixel(s) are enhanced by exposing the identified center pixel(s) with additional dose that affects only the smaller features. The step facilitates by moving the edge of the feature closer to its design size.

FIG. 12B is a flowchart illustrating a process 140 for gray scale lithography employing inner pixel modulation for defining edges. In particular, at step 142, edge locations are identified with reference to the grid. For example, a first proximal interior pixel immediately interior to an unbiased edge of each feature is identified. Optionally, a second pixel immediately exterior to the unbiased edge may be identified.

At step 144, the additional dosage required for the inner pixel in order to place edge at proper location is determined. In particular, a set of new GLs and application is used with greater than normal intensities. The elevated intensities are above the normal full dose and the new set of gray levels biases the edge of the feature and facilitates in further moving the edge of the feature in more exact fractional increments of a pixel from the biased edge depending upon the gray level selected.

With the optional second pixel, the second pixel may be exposed with a dosage selected from a second set of gray levels to facilitate in further moving the edge of the feature depending upon the gray level selected until the edge moves across the location at which time it is modulated to move the edge in 5 nm increments. The second pixel is immediately interior to the edge of the feature after the first proximal interior pixel is exposed for a subset of the first set of gray level intensities. The second set of gray levels for the second pixel contains levels set to 0 for levels corresponding to edge positions interior to the second pixel. At step 146, the pattern is exposed using the gray levels determined in step 144.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A method for gray scale lithography for defining edges of features, comprising the steps of:
    identifying a center of a feature by identifying one or two most central pixels of the feature depending upon the width of the feature;
    exposing the general width of the feature with normal doses; and
    enhancing the identified center by exposing the identified center with additional dose so that the identified center is exposed with greater than normal dose,
    whereby the edge of the feature is placed more accurately by counteracting adverse edge-edge interference for small features.

2. The method for gray scale lithography of claim 1, wherein said exposing includes taking into account an increase in feature size resulting from the enhancing step.

3. The method for gray scale lithography of claim 1, wherein said additional dose for the center is approximately 7% additional to a full dose.

4. The method for gray scale lithography of claim 1, wherein said identifying identifies one most central pixel where the width of the features is approximately an odd number of pixels and two most central pixels where the width of the features is approximately an even number of pixels.

5. The method for gray scale lithography of claim 1, further comprising the step of determining a spot size to pixel space ratio, wherein the number of pixels identified in said identifying the center is determined by writing beam spot size to pixel space ratio.

6. The method for gray scale lithography of claim 5, wherein one or two central pixels are identified where the writing beam spot size to pixel space ratio is approximately 3.

7. The method for gray scale lithography of claim 1, wherein said enhancing the identified center is selected from exposing in an additional writing pass and enhancing during said step of exposing with a dose higher than normal gray level.

8. The method for gray scale lithography of claim 1, wherein the feature is one of a one dimensional feature and a two dimensional feature.

9. The method for gray scale lithography of claim 1, further comprising the step of selecting features to which said step of enhancing is to be performed, wherein said selecting comprises selecting at least one of features under a predetermined threshold size, primary features, and features formed after fracturing.

10. A method for gray scale lithography for defining edges of features, comprising the steps of;
   identifying a proximal interior pixel immediately interior to an unbiased edge of a feature;
   exposing the general width of the feature with full dosage; and
   exposing the proximal interior pixel with a dosage of elevated intensity selected from a first set of gray levels, the elevated intensities being above the full dosage, the first set of gray levels steepens the edge of the feature and moves the edge depending upon the gray level selected.

11. The method for gray scale lithography of claim 10, wherein the edge of the feature is controlled solely by the proximal interior pixel.

12. The method for gray scale lithography of claim 10, wherein the elevated intensities of the first set of gray levels range from approximately 1 times normal dose to approximately 3 times normal dose.

13. The method for gray scale lithography of claim 10, further comprising the steps of:
   identifying a second pixel immediately exterior to the unbiased edge, the second pixel being immediately interior to the edge of the feature after said step of exposing the proximal interior pixel for a subset of the first set of gray level intensities;
   exposing the second pixel with a dosage selected from a second set of gray levels to facilitate in further moving the edge of the feature depending upon the gray level selected, the second set of gray levels for the second pixel containing levels set to 0 for levels corresponding to edge positions interior to the second pixel.

14. The method for gray scale lithography of claim 13, wherein the second set of gray levels contains levels set to 0 for levels corresponding to edge positions interior to the second pixel and levels set to greater than 0 for levels corresponding to edge positions exterior to the second pixel.

15. The method for gray scale lithography of claim 13, wherein the second set of gray levels for the second pixel comprises 16 levels, the first 8 levels being set to 0.

16. The method for gray scale lithography of claim 15, wherein the set of gray levels for the proximal interior pixel increases from the first to the eighth level to move the edge a distance of approximately equal to 1/2 of a pixel separation.

17. The method for gray scale lithography of claim 13, wherein the set of gray levels for the second pixel ranges from 0 to approximately 1.2.

18. The method for gay scale lithography of claim 13, wherein the set of gray levels for the proximal interior pixel ranges from approximately 1.1 to approximately 2.

* * * * *